United States Patent
Ueno et al.

(10) Patent No.: US 7,381,282 B2
(45) Date of Patent: Jun. 3, 2008

(54) CO ALLOY TARGET AND ITS PRODUCTION METHOD, SOFT MAGNETIC FILM FOR PERPENDICULAR MAGNETIC RECORDING AND PERPENDICULAR MAGNETIC RECORDING MEDIUM

(75) Inventors: Tomonori Ueno, Shimane-ken (JP); Hide Ueno, Novi, MI (US); Hiroshi Takashima, Shimane-ken (JP); Mitsuharu Fujimoto, Shimane-ken (JP)

(73) Assignee: Hitachi Metals, Ltd., Tokyo (JP)

( * ) Notice: Subject to any disclaimer, the term of this patent is extended or adjusted under 35 U.S.C. 154(b) by 548 days.

(21) Appl. No.: 11/098,399

(22) Filed: Apr. 5, 2005

(65) Prior Publication Data
US 2005/0223848 A1    Oct. 13, 2005

(30) Foreign Application Priority Data
Apr. 7, 2004    (JP) .............................. 2004-113479

(51) Int. Cl.
*H01F 1/147* (2006.01)
(52) U.S. Cl. ...................... 148/313; 148/425; 420/435; 204/298.12
(58) Field of Classification Search ...................... None
See application file for complete search history.

(56) References Cited

FOREIGN PATENT DOCUMENTS

JP    09-282656    10/1997
JP    63-201912    8/1998

*Primary Examiner*—John P. Sheehan
(74) *Attorney, Agent, or Firm*—Sughrue Mion, PLLC

(57) ABSTRACT

A Co alloy target comprising 1 to 10 atomic % of Zr and 1 to 10 atomic % of Nb and/or Ta, the balance being unavoidable impurities and Co, is produced by rapidly solidifying a melt of the Co alloy to produce an alloy powder, classifying the alloy powder to maximum particle size of 500 μm or less, and pressure-sintering the classified alloy powder.

5 Claims, 2 Drawing Sheets

50 μm

CO ALLOY TARGET AND ITS PRODUCTION METHOD, SOFT MAGNETIC FILM FOR PERPENDICULAR MAGNETIC RECORDING AND PERPENDICULAR MAGNETIC RECORDING MEDIUM

FIELD OF THE INVENTION

The present invention relates to a Co alloy target for forming a soft magnetic film and its production method, a soft magnetic film formed by using such a Co alloy target, and a perpendicular magnetic recording medium comprising such a soft magnetic film.

BACKGROUND OF THE INVENTION

Recent remarkable development of magnetic recording technologies has provided large-capacity drives with magnetic recording media having higher recording densities. However, longitudinal magnetic recording media widely used at present need small recording bits and thus high coercivity to such extent that recording cannot be conducted by magnetic heads, to have higher magnetic recording density. To solve these problems, perpendicular magnetic recording with high recording density has been researched.

Perpendicular magnetic recording is conducted on a recording medium whose magnetic film has a magnetization easy-axis vertical to its surface, with a small demagnetizing field in bits and little deterioration of read-write characteristics even at an increased recording density, thus suitable for a high magnetic recording density. Developed for the perpendicular magnetic recording is a double-layer recording medium with high recording sensitivity, which comprises a magnetic recording film and a soft magnetic film.

As the soft magnetic film for the double-layer recording medium, soft magnetic Co alloy films were proposed by JP 08-014889 B and JP 09-282656 A.

The formation of the soft magnetic films in the double layer media described in JP 08-014889 B and JP 09-282656 A is generally conducted by a magnetron sputtering method. The magnetron sputtering method comprises causing a magnetic flux to leak onto a target surface with a magnet disposed on the rear side of a target, and concentrating plasma in a region of the leaked magnetic flux to form a thin film at a high speed. Because the unevenness of crystal orientation and metal structure of a magnetic target leads to the unevenness of the leaked magnetic flux and thus the unevenness of a sputtered film in the magnetron sputtering method, it is important to develop a target with little unevenness. In the sputtering method, dust called particles is generated from the target during sputtering. It is thus important to suppress the generation of particles. Because there is an extremely brittle intermetallic compound phase, which tends to constitute the particles, particularly in the Co alloy target containing Zr, Nb, Ta, etc., it is extremely important to control the shape and distribution of the intermetallic compound phase.

Because Zr is not substantially dissolved in Co, brittle intermetallic compounds are formed even if Zr is added in a small amount. Accordingly, it is extremely important to control the structure of a Zr-containing Co alloy.

OBJECTS OF THE INVENTION

Accordingly, an object of the present invention is to provide a Co alloy target capable of forming a sputtered soft magnetic film with reduced unevenness and reduced particles.

Another object of the present invention is to provide a method for producing such a Co alloy target.

A further object of the present invention is to provide a soft magnetic film for perpendicular magnetic recording, which is formed by using the above Co alloy target.

A still further object of the present invention is to provide a perpendicular magnetic recording medium comprising at least one such soft magnetic film.

SUMMARY OF THE INVENTION

As a result of investigation on the metal structure of a Co alloy target for Zr-containing soft magnetic films, the inventors have found that the unevenness of crystal orientation and metal structure of a target can be suppressed by rapidly solidifying a Co alloy melt and pressure-sintering the resultant alloy powder, and that the sputtering of a Co alloy target having a Co solid solution phase and an intermetallic compound phase finely distributed in the metal structure can provide a soft magnetic film with little unevenness and particles. The present invention has been achieved by these findings.

Thus, the method of the present invention for producing a Co alloy target comprising 1 to 10 atomic % of Zr and 1 to 10 atomic % of Nb and/or Ta, the balance being unavoidable impurities and Co, comprises the steps of:

rapidly solidifying a melt of the Co alloy to produce an alloy powder;

classifying the alloy powder to a maximum particle size of 500 μm or less; and pressure-sintering the classified alloy powder to the target.

The rapid solidification is preferably carried out by gas atomization. The pressure-sintering of the alloy powder is preferably carried out by hot-isostatic pressing.

The Co alloy target of the present invention comprises 1 to 10 atomic % of Zr and 1 to 10 atomic % of Nb and/or Ta, the balance being unavoidable impurities and Co, an X-ray diffraction intensity ratio [I(111)/I(200)] of a (111) plane to (200) plane being 1.2 to 5 in an fcc-Co phase, and/or an X-ray diffraction intensity ratio [I(10-11)/I(0002)] of a (10-11) plane to a (0002) plane being 0.8 to 3.5 in an hcp-Co phase.

The Co alloy target preferably has a structure comprising a Co solid solution phase and an intermetallic compound phase, the maximum inscribed circle that can be drawn in a region having substantially no intermetallic compound phase having a diameter of 10 μm or less.

The Co alloy target preferably has a maximum magnetic permeability of less than 100. It also preferably has an oxygen content of 300 ppm or less. It further preferably has an Fe content of 100 ppm or less.

The soft magnetic film of the present invention for perpendicular magnetic recording is produced by using the above Co alloy target.

The perpendicular magnetic recording medium of the present invention comprises at least one soft magnetic film produced by using the above Co alloy target.

BEST MODE FOR CARRYING OUT THE INVENTION

Figure 1:
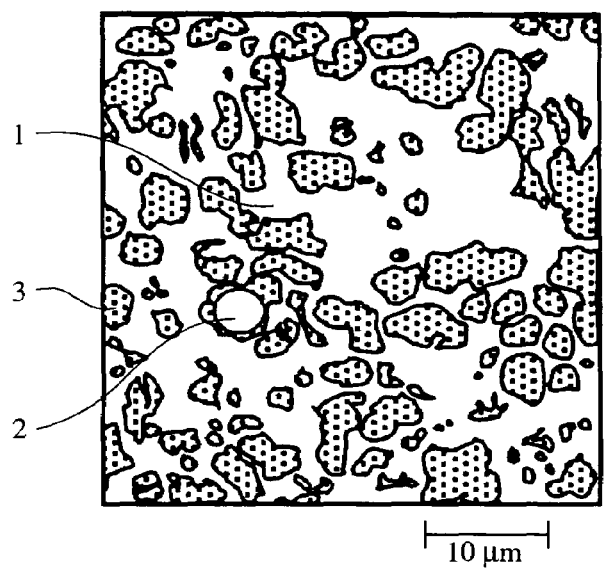
FIG. 1 is a schematic view showing the metal structure of the Co alloy target of the present invention.

An important feature of the present invention is that a Co alloy target indispensably containing Zr is produced by rapidly solidifying a Co alloy melt and pressure-sintering the resultant alloy powder with a controlled particle size.

A Co alloy comprising 1 to 10 atomic % of Zr and 1 to 10 atomic % of Nb and/or Ta, the balance being unavoidable impurities and Co, can be sputtered to form an amorphous soft magnetic film with no magnetostriction and magnetic anisotropy. This Co alloy film can be formed by using a Co alloy target having the same composition, whose metal structure stably contains Co-based intermetallic compounds such as $Co_{23}Zr_6$, $Co_2Zr$, $Co_5Zr$, $Co_7Nb_2$, $Co_2Nb$, $Co_7Ta_2$, $Co_2Ta$. Because the intermetallic compounds are extremely brittle, they tend to form particles during sputtering when the intermetallic compounds exist as a coarse phase. Because the intermetallic compound phase has greatly different shape and distribution depending on the production method of the target, it is possible to control the shape and distribution of the intermetallic compound phase by the production method.

Because Zr is not substantially dissolved in a Co matrix, brittle intermetallic compounds are formed even if Zr is added in a small amount. Accordingly, the structural control of the Zr-containing Co-based alloy is extremely important.

Though the Co alloy has conventionally been produced by a vacuum-casting method, the vacuum-cast Co alloy has a metal structure having crystal orientation in alignment with a solidification direction. It also contains greatly laminar-grown intermetallic compounds, meaning that an intermetallic compound phase with weak magnetism and a Co solid solution with strong magnetism are non-uniformly distributed. With an uneven sputtering rate variable with crystal orientation and an uneven leaked magnetic flux during magnetron sputtering, a cast Co alloy target provides non-uniform sputtered soft magnetic films.

Though the structure of the cast alloy can be controlled by plastic working such as hot-rolling, a Co alloy comprising 1 to 10 atomic % of Zr and 1 to 10 atomic % of Nb and/or Ta, the balance being unavoidable impurities and Co, contains extremely brittle intermetallic compounds, making plastic working difficult. Accordingly, the structure of such a Co alloy cannot be fully controlled by plastic working.

As a result of investigation on the production method of a Co alloy target, the inventors have found that the rapid solidification of a Co alloy melt and the pressure-sintering of the resultant alloy powder having a particle size of 500 μm or less can provide a target suitable for sputtering, which has a metal structure comprising a Co solid solution phase and an intermetallic compound phase, which are uniformly and finely distributed, without suffering from extreme laminar growth of the intermetallic compound phase and extreme growth of the Co solid solution phase. The reasons therefor are presumed that rapid solidification produces Co alloy powder while suppressing the growth of the Co solid solution phase and permitting the intermetallic compound phase to grow as if it surrounds the Co solid solution phase without laminar growth, and that the pressure sintering of the Co alloy powder keeps such a fine metal structure.

Rapid solidification for forming alloy powder may be conducted by a method of pulverizing an ingot formed by rapidly solidifying a melt, an atomizing method by which an alloy melt is atomized with water or a gas, etc. Among them, a gas-atomizing method is preferable because it can produce alloy powder free from impurities such as oxygen.

The pressure-sintering method may be a hot-pressing method applying two-dimensional pressure, or a hot-isostatic pressing method applying high three-dimensional pressure. Among them, the hot-isostatic pressing method that can produce high-density sintered bodies at relatively low temperature and high pressure is preferable, to suppress the growth of crystal grains and intermetallic compounds during sintering. The conditions of the hot-isostatic pressing method are preferably a temperature of 500 to 1250° C., and a pressure of 50 to 200 MPa for 0.5 to 10 hours, to improve a sintering density while avoiding the metal structure to become coarse without generating a liquid phase.

In the method of the present invention, the maximum particle size of the Co alloy powder is preferably 250 μm or less to prevent the metal structure from becoming coarse and uneven. The particle size of the Co alloy powder can be adjusted by sieving.

Another important feature of the present invention is that the crystal orientation of the Co solid solution is kept random to suppress the unevenness of a sputtered soft magnetic film. Because sputtered particles are projected at an angle greatly depending on the crystal orientation, unevenness occurs in the sputtered films if the crystal orientation is predominant in particular directions.

To keep substantially random crystal orientation in the Co alloy target of the present invention comprising 1 to 10 atomic % of Zr and 1 to 10 atomic % of Nb and/or Ta, the balance being unavoidable impurities and Co, it is necessary that an X-ray diffraction intensity ratio $[I(111)/I(200)]$ of a (111) plane to (200) plane is 1.2 to 5 in an fcc-Co phase, and/or that an X-ray diffraction intensity ratio $[I(10\text{-}11)/I(0002)]$ of a (10-11) plane to a (0002) plane is 0.8 to 3.5 in an hcp-Co phase. The Co alloy with random crystal orientation has $[I(111)/I(200)]$ of about 2.5 in fcc-Co and $[I(10\text{-}11)/I(0002)]$ of about 1.67 in hcp-Co. If the X-ray diffraction intensity ratios $[I(111)/I(200)]$ and $[I(10\text{-}11)/I(0002)]$ were outside the above ranges, the crystal orientation would be predominant in particular directions, resulting in remarkable unevenness occurring in the sputtered films.

To reduce the generation of particles during sputtering, it is preferable to suppress the growth of a Co solid solution phase and the formation of laminar coarse intermetallic compounds in the metal structure of the Co alloy target of the present invention. Specifically, the diameter of the maximum circle inscribed in a region having substantially no intermetallic compound phase in the target structure is preferably 10 μm or less. When the diameter of the maximum inscribed circle is more than 10 μm, the extremely grown intermetallic compound phase and the Co solid solution phase are unevenly distributed, resulting in higher likelihood of generating particles, unevenness in a leaked magnetic flux during magnetron sputtering, and thus higher likelihood of generating unevenness in the sputtered soft magnetic film.

The Co alloy target of the present invention preferably has a maximum magnetic permeability of less than 100. When the maximum magnetic permeability is 100 or more, there is a small leaked magnetic flux during magnetron sputtering, resulting in extremely lowered sputtering efficiency. The maximum magnetic permeability can be further reduced by finely and uniformly dispersing the intermetallic compound phase in the Co solid solution phase.

The Co alloy target of the present invention preferably has an oxygen content of 300 ppm or less. The oxygen content exceeding 300 ppm would deteriorate the magnetic properties of sputtered soft magnetic films and greatly increase the amount of oxides (inclusions) in the target. Increase in the inclusions leads to drastically increased chance of generating irregular discharge during sputtering.

The Co alloy target of the present invention preferably has an Fe content of 100 ppm or less. The Fe content exceeding 100 ppm would largely deteriorate the soft magnetic properties of sputtered soft magnetic films.

The soft magnetic film formed by using the Co alloy target of the present invention is substantially free from unevenness with reduced numbers of particles, suitable for perpendicular magnetic recording. This soft magnetic film can be formed in at least one layer to provide a perpendicular magnetic recording medium, which can perform high magnetic recording.

The present invention will be explained in more detail by Examples below, without intention of restricting the present invention thereto.

EXAMPLES 1-3, AND COMPARATIVE EXAMPLES 1-3

Each of gas-atomized alloy powders of $Co_{90}Zr_5Nb_5$, $Co_{86}Zr_7Ta_7$ and $Co_{92}Zr_5Ta_3$ by atomic % was classified to a maximum particle size of 250 μm or less, and charged into a low-carbon steel capsule. Each low-carbon steel capsule containing the atomized alloy powder was evacuated, sealed and then sintered by a hot-isostatic pressing method at 100 MPa and 900° C. for 2 hours. The resultant sintered Co alloy was machined to provide a target of 100 mm in diameter and 5 mm in thickness. For comparison, each of alloy melts of $Co_{90}ZrNb_5$, $Co_{86}Zr_7Ta_7$ and $Co_{92}Zr_5Ta_3$ by atomic % was cast to an ingot in vacuum. Each Co alloy ingot was machined to provide a target of 100 mm in diameter and 5 mm in thickness.

Each of the above targets was measured by an X-ray diffraction method with respect to X-ray diffraction intensities I(111) and I(200) of a (111) plane and a (200) plane, respectively, in an fcc-Co phase, and X-ray diffraction intensities I(10-11) and I(0002) of a (10-11) plane and a (0002) plane, respectively, in an hcp-Co phase. X-ray diffraction intensity ratios [I(111)/I(200)] and [I(10-11)/I(0002)] were calculated from the measured X-ray diffraction intensities of the above crystal planes. The results are shown in Table 1. Table 1 also includes each X-ray diffraction intensity ratio at random crystal orientation, which is obtained from JCPDS (The Joint Committee on Powder Diffraction Standards) Card.

TABLE 1

| No. | Composition (atomic %) | [I(111)/I(200)][(1)] | [I(10-11)/I(0002)][(2)] |
|---|---|---|---|
| Example 1 | $Co_{90}Zr_5Nb_5$ | 3.3 | 1.4 |
| Example 2 | $Co_{86}Zr_7Ta_7$ | 2.3 | 1.7 |
| Example 3 | $Co_{92}Zr_5Ta_3$ | 2.6 | 0.5 |
| Comparative Example 1 | $Co_{90}Zr_5Nb_5$ | 10.5 | 23.5 |
| Comparative Example 2 | $Co_{86}Zr_7Ta_7$ | 12.3 | 21.3 |
| Comparative Example 3 | $Co_{92}Zr_5Ta_3$ | 13.1 | 22.8 |
| | JCPDS Card | 2.5 | 1.67 |

Note [(1)] An X-ray diffraction intensity ratio [I(111)/I(200)] in the fcc-phase.
[(2)] An X-ray diffraction intensity ratio [I(10-11)/I(0002)] in the hcp-phase.

The microstructures of the above targets were observed by a scanning electron microscope (SEM) and an energy-dispersive X-ray fluorescence (EDX) analyzer. As shown in FIG. 1, the diameter of the maximum inscribed circle 2 in a region having no intermetallic compound phase 1 was measured on a SEM photograph (magnification: 1000) of the metal structure of each target.

A test piece of 30 mm in length, 10 mm in width and 5 mm in thickness machined from each target was measured with respect to a maximum magnetic permeability by a DC magnetic flux meter. Each test piece was also measured with respect to an oxygen content by a LECO method, and an Fe content by an ICP method. The results are shown in Table 2.

TABLE 2

| No. | Composition (atomic %) | Diameter of Maximum Inscribed Circle (μm) | Maximum Magnetic Permeability | Oxygen Content (ppm) | Fe Content (ppm) |
|---|---|---|---|---|---|
| Example 1 | $Co_{90}Zr_5Nb_5$ | 4 | 16 | 230 | 40 |
| Example 2 | $Co_{86}Zr_7Ta_7$ | 3 | 12 | 290 | 50 |
| Example 3 | $Co_{92}Zr_5Ta_3$ | 3 | 25 | 160 | 35 |
| Comparative Example 1 | $Co_{90}Zr_5Nb_5$ | 17 | 22 | 40 | 40 |
| Comparative Example 2 | $Co_{86}Zr_7Ta_7$ | 14 | 18 | 60 | 40 |
| Comparative Example 3 | $Co_{92}Zr_5Ta_3$ | 13 | 40 | 30 | 50 |

Figure 2:
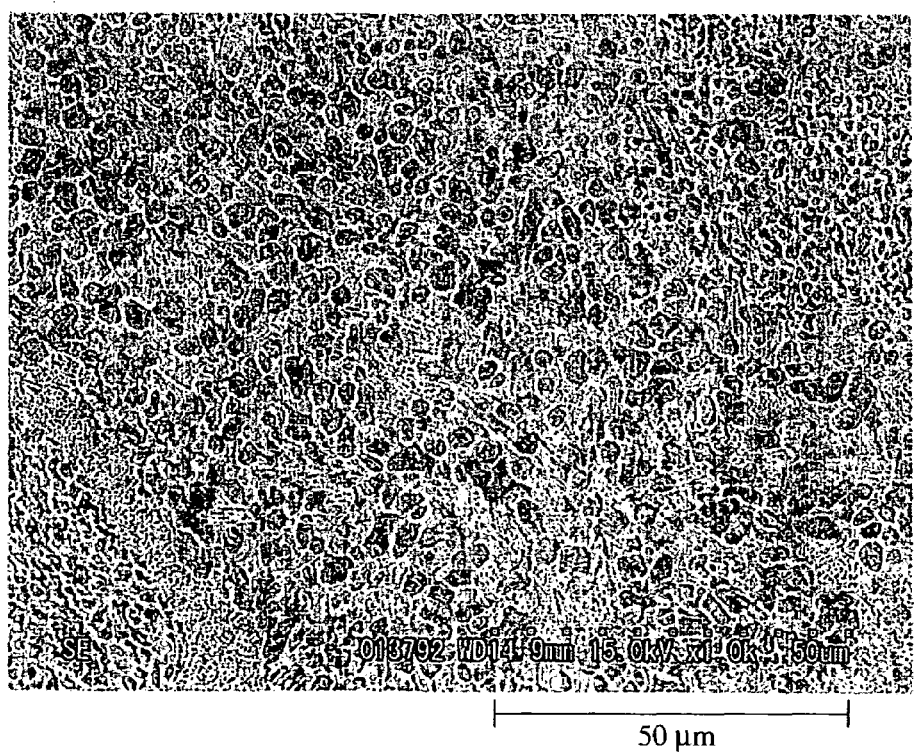
FIG. 2 is a scanning electron photomicrograph showing the cross-section microstructure of the sample of Example 1.
Figure 3:
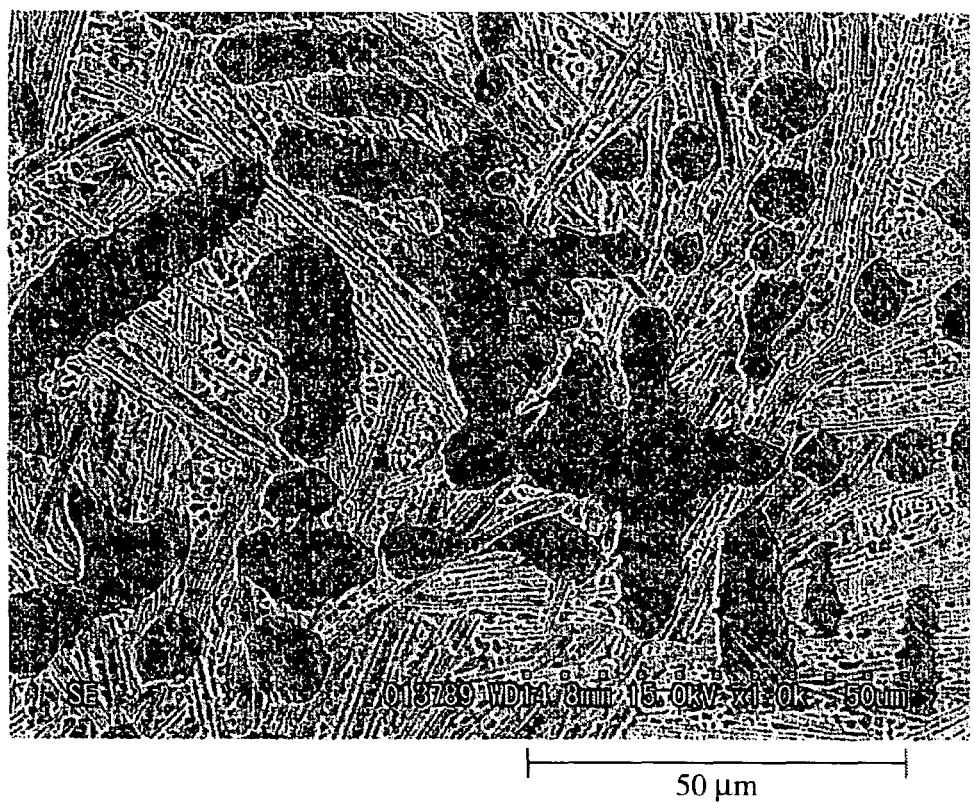
FIG. 3 is a scanning electron photomicrograph showing the cross-section microstructure of the sample of Comparative Example 1.

FIGS. 2 and 3 are scanning electron photomicrographs showing the cross-section microstructures of Example 1 and Comparative Example 1 shown in Table 1. In each photomicrograph, the Co solid solution phase is dark gray, and the intermetallic compound phase is pale gray. FIG. 2 indicates that the Co solid solution phase and the intermetallic compound phase were finely distributed in the target of Example 1. FIG. 3 indicates that the target of Comparative Example 1 had a structure containing a large Co solid solution phase and a greatly laminar-grown intermetallic compound phase.

Using each of the above targets, a 0.5-μm-thick sputtered film was formed on a 3-inch Si substrate at an Ar pressure of 0.5 Pa and a DC power of 500 W. The measured number of particles (defects) on a sputtered Si substrate is shown in Table 3 by a relative number with that of Example 1 as 100.

TABLE 3

| No. | Composition (atomic %) | Number of Particles |
|---|---|---|
| Example 1 | $Co_{90}Zr_5Nb_5$ | 100 |
| Example 2 | $Co_{86}Zr_7Ta_7$ | 110 |
| Example 3 | $Co_{92}Zr_5Ta_3$ | 95 |
| Comparative Example 1 | $Co_{90}Zr_5Nb_5$ | 250 |
| Comparative Example 2 | $Co_{86}Zr_7Ta_7$ | 300 |
| Comparative Example 3 | $Co_{92}Zr_5Ta_3$ | 230 |

It is clear from Tables 1 to 3 and FIGS. 2 and 3 that the Co solid solution phase and the intermetallic compound are finely and uniformly distributed in the Co alloy targets of the present invention having random-oriented crystal orientation. With the diameter of the maximum circle inscribed in a region having no intermetallic compound phase controlled to 10 μm or less, the Co alloy target of the present invention generates reduced numbers of particles during sputtering. The Co alloy target of the present invention can be stably sputtered to form soft magnetic Co alloy films, which are particularly effective to produce perpendicular magnetic recording media.

What is claimed is:

1. A Co alloy target comprising 1 to 10 atomic % of Zr and 1 to 10 atomic % of Nb and/or or Ta, the balance being unavoidable impurities and Co, wherein an X-ray diffraction intensity ratio [I(111)/I(200)] of a (111) plane to (200) plane is 1.2 to 5 in an fcc-Co phase, and/or an X-ray diffraction intensity ratio [I(10-11)/I(0002)] of a (10-11) plane to a (0002) plane is 0.8 to 3.5 in an hcp-Co phase.

2. The Co alloy target according to claim 1, wherein it has a structure comprising a Co solid solution phase and an intermetallic compound phase, the maximum inscribed circle that can be drawn in a region having substantially no intermetallic compound phase having a diameter of 10 μm or less.

3. The Co alloy target according to claim 2, wherein it has a maximum magnetic permeability of less than 100.

4. The Co alloy target according to claim 2, wherein it has an oxygen content of 300 ppm or less.

5. The Co alloy target according to claim 2, wherein it has an Fe content of 100 ppm or less.

* * * * *